United States Patent [19]
Sultan

[11] Patent Number: 5,970,353
[45] Date of Patent: Oct. 19, 1999

[54] REDUCED CHANNEL LENGTH LIGHTLY DOPED DRAIN TRANSISTOR USING A SUB-AMORPHOUS LARGE TILT ANGLE IMPLANT TO PROVIDE ENHANCED LATERAL DIFFUSION

[75] Inventor: Akif Sultan, Santa Clara, Calif.

[73] Assignee: Advanced Micro Devices, Inc., Sunnyvale, Calif.

[21] Appl. No.: 09/050,730

[22] Filed: Mar. 30, 1998

[51] Int. Cl.[6] ................................................. H01L 21/336
[52] U.S. Cl. ........................ 438/302; 438/289; 438/290; 438/291; 438/305; 438/306; 438/516; 438/525; 438/528; 438/232
[58] Field of Search .................................... 438/302, 289, 438/290, 291, 306, 305, 516, 525, 528, 232, FOR 158, FOR 169, FOR 204

[56] References Cited

U.S. PATENT DOCUMENTS

| | | |
|---|---|---|
| 4,755,775 | 7/1988 | Marczewski et al. . |
| 4,861,729 | 8/1989 | Fuse et al. ................................ 437/18 |
| 5,360,749 | 11/1994 | Anjum et al. . |
| 5,470,794 | 11/1995 | Anjum et al. . |
| 5,500,379 | 3/1996 | Odake et al. ............................. 437/34 |
| 5,574,685 | 11/1996 | Hsu . |
| 5,593,907 | 1/1997 | Anjum et al. . |

FOREIGN PATENT DOCUMENTS

| | | |
|---|---|---|
| 0 258 148 A2 | 3/1988 | European Pat. Off. . |
| 0 731 494 A2 | 9/1996 | European Pat. Off. . |
| 0 806 794 A2 | 11/1997 | European Pat. Off. . |
| 6267974 | 9/1994 | Japan .......................... 438/FOR. 169 |

OTHER PUBLICATIONS

PCT International Search Report, International Application No. PCT/US98/24907, mailed Mar. 26, 1999.

"An approach using a subamorphizing threshold dose silicon implant of optimal energy to achieve shallower junctions", Akif Sultan and Sanjay Banerjee, Journal of Applied Physics, vol. 83, No. 12, 1998 American Institute of Physics, Jun. 15, 1998, pp. 8046–8050.

*Primary Examiner*—Peter Toby Brown
*Assistant Examiner*—Long Pham
*Attorney, Agent, or Firm*—Renner, Otto, Boisselle & Sklar, P.L.L.

[57] ABSTRACT

A method of reducing an effective channel length of a lightly doped drain transistor (50), includes the steps of forming a gate electrode (52) and a gate oxide (54) over a semiconductor substrate (56) and implanting a drain region (58) of the substrate (56) with a sub-amorphous large tilt angle implant to thereby supply interstitials (62) at a location under the gate oxide (54). The method also includes forming a lightly doped drain extension region (66) in the drain region (58) of the substrate (56) and forming a drain (70) in the drain region (58) and forming a source extension region (67) and a source (72) in a source region (60) of the substrate (56). Lastly, the method includes thermally treating the substrate (56), wherein the interstitials (62) enhance a lateral diffusion (84) under the gate oxide (54) without substantially impacting a vertical diffusion (86) of the extension regions (66, 67), thereby reducing the effective channel length without an increase in a junction depth of the drain (70) and the drain extension region (66) or the source (72) and the source extension region (67).

15 Claims, 4 Drawing Sheets

REDUCED CHANNEL LENGTH LIGHTLY DOPED DRAIN TRANSISTOR USING A SUB-AMORPHOUS LARGE TILT ANGLE IMPLANT TO PROVIDE ENHANCED LATERAL DIFFUSION

FIELD OF THE INVENTION

The present invention is generally directed toward integrated circuit manufacturing and is more particularly related to a method of forming a reduced channel length lightly doped drain (RCL-LDD) transistor structure to thereby provide for a reduction in the effective channel length of the transistor without adversely increasing the vertical junction depth of the LDD extension region.

BACKGROUND OF THE INVENTION

Transistor devices make up one of the integral components of today's integrated circuits. Consequently, a reduction in the size of transistors (often called "scaling") is constantly being pursued. Prior art FIG. 1 is a fragmentary cross section diagram illustrating a conventional MOS type transistor 10. The transistor 10 consists of a conductive gate region 12 overlying a thin gate oxide 14 which overlies a substrate 16. The gate 12 and the gate oxide 14 are disposed between a drain region 18 and a source region 20 which are formed in the substrate 16 having a channel region 22 located therebetween which underlies the gate 12 and the gate oxide 14.

As the conventional transistor 10 is scaled into the submicron range to reduce its dimensions and thereby improve the transistor packing density on a chip, the transistor 10 begins to experience hot-carrier effects, as illustrated in prior art FIG. 2. These undesirable hot-carrier effects become more evident when the transistor 10 is scaled while maintaining the supply voltage constant or when the supply voltage is not reduced as rapidly as the structural features of the transistor.

The hot-carrier effects are due to an increase in the electrical field within the channel region 22. The increased electric field causes electrons in an inversion layer 26 to be accelerated (or "heated") to an extent that several different undesirable phenomena occur. As illustrated in prior art FIG. 2, the hot-carrier effects can include charge injection, substrate current and electron injection into the gate oxide 14. Perhaps the most crucial hot-carrier effect is the charge injection into the gate oxide 14 which damages the thin oxide and leads to a time-dependent degradation of various transistor characteristics such as the threshold voltage ($V_T$), the linear transconductance ($g_m$) and the saturation current ($I_{DSAT}$).

One prior art solution which reduces the undesired hot-carrier effects of traditional transistor structures is the lightly doped drain (LDD) transistor 30, which is illustrated in prior art FIG. 3. The LDD transistor 30 includes the gate 12 and the gate oxide 14 formed in a conventional manner, wherein a lightly doped drain extension region 32 is formed adjacent to the drain region 18 between the drain region 18 and the channel 22. The lightly doped drain extension region 32 typically reduces the electric field near the channel region 22 by about 30–40 percent and thus the hot-carrier reliability of the transistor is greatly improved. The extension region 32 reduces the electric field by effectively dropping a portion of the drain voltage across the extension region 32.

As transistor designers continue to scale down the transistor device dimensions, the junction depths of the source and drain regions (as well as the lightly doped drain extension region) also need to be reduced (i.e., make the junctions more shallow). Junction depths must be reduced in conjunction with scaling in order to prevent short channel transistor effects such as punchthrough and threshold voltage shift. One conventional approach to reducing the junction depth is to reduce the implant energy used to form the junctions and reduce the diffusion of the junctions in the vertical direction. Reducing the effective channel length (to get higher drive current) using the conventional approach by enhanced lateral diffusion would be accompanied by deeper junctions leading to degradation of short channel effects. Thus, using the conventional approach for a fixed gate size, the channel length cannot be reduced using the prior art method since it would result in deeper junctions. A smaller channel length would, however, be a benefit as it would help to improve the drive current. Consequently, designers have been faced with the design trade-off of reducing junction depths (to reduce short channel effects) and having longer channel lengths (leading to reduced drive current) as the transistor size is reduced.

It is an object of the present invention to overcome the limitation of the prior art by providing a decrease in the effective channel length to thereby provide for a reduced transistor sizing without experiencing transistor degradation due to short channel effects associated with deeper junctions. In other words, it is an object of the present invention to overcome the limitation posed by the conventional design methods whereby the channel length for a given gate size cannot be reduced by providing deeper junctions, as that would lead to degradation of transistor performance.

SUMMARY OF THE INVENTION

The present invention relates to a method of reducing the effective channel length of a lightly doped drain transistor without substantially impacting the junction depth of the source/drain and source/drain extension regions. Consequently, the invention allows for a reduction in transistor size without increasing the junction depth and thereby avoids the undesirable short channel effects associated with increased junction depths.

According to one aspect of the present invention a reduction in the effective channel length of a transistor without an increase in the junction depth is accomplished by performing a large tilt angle implant in conjunction with the formation of the source/drain and source/drain extension regions. The large tilt angle implant is a shallow implant and places interstitials near the lateral edge of the source/drain extension region under the gate oxide. The interstitials enhance the lateral diffusion of the source/drain extension region without substantially affecting the vertical diffusion of the source/drain and source/drain extension region. Consequently, the effective channel length of the transistor is reduced without an appreciable increase in transistor junction depth.

According to another aspect of the present invention, a first sidewall spacer is formed on the gate and the gate oxide prior to the large tilt angle implant. The first sidewall spacer has a thickness that adjusts the lateral extent to which the interstitials are formed below the gate oxide. When the first sidewall spacer is thin, the interstitials significantly extend under the gate oxide; when the sidewall spacer thickness is increased, the lateral extent to which the interstitials extend under the gate oxide is decreased. Consequently, the amount of the transistor gate-to-drain overlap capacitance can be customized independently of the junction depth of the drain and the drain extension region.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
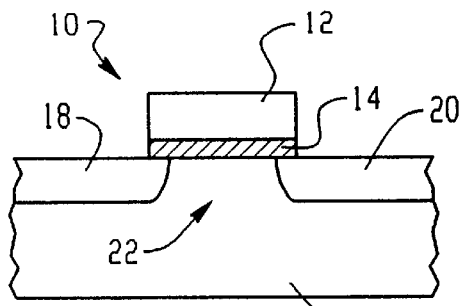
FIG. 1 is a fragmentary cross section diagram of a prior art MOS transistor structure.
Figure 2:
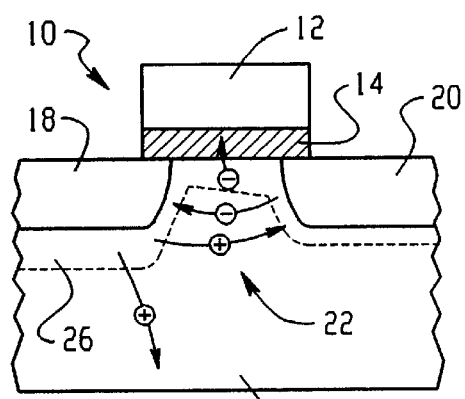
FIG. 2 is a fragmentary cross section diagram illustrating hot-carrier effects associated with a prior art short channel type MOS transistor structure.
Figure 3:
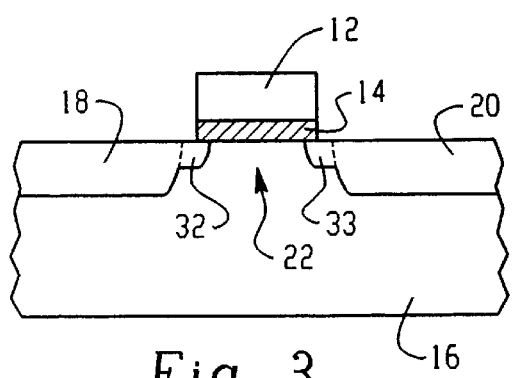
FIG. 3 is a fragmentary cross section diagram illustrating a prior art lightly doped drain MOS transistor structure.

The present invention will now be described with reference to the drawings wherein like reference numerals are used to refer to like elements throughout. One aspect of the present invention relates to a method of improving the drive current capability as the transistor is scaled down without degrading the short channel characteristics. The invention overcomes what has conventionally been a design limitation by performing a large tilt angle implant in conjunction with the formation of a lightly doped drain extension region. The large tilt angle implant is a shallow implant and generates interstitials near the surface of the semiconductor substrate in a drain region that extend beneath the gate oxide near the lateral edge of the drain extension region. The interstitials near the lateral edge of the drain extension region enhance the lateral diffusion of the drain extension region underneath the gate oxide without substantially affecting the vertical diffusion of the drain and the drain extension region. Consequently, the effective channel length of the device is decreased without increasing the depth of the junctions, thereby allowing the drive current to be improved and minimizing hot-carrier effects without adversely affecting short channel effects.

According to another aspect of the present invention, the reduction in the effective channel length of the transistor may be customized by forming a sidewall spacer, wherein a thickness of the spacer dictates the extent to which the effective transistor channel length is reduced. For example, when the sidewall spacer is thick, the lateral edge of the lightly doped drain extension region and the interstitials generated by the large tilt angle implant extend only slightly underneath the gate oxide, and wherein when the sidewall spacer is thin, the extension region and the interstitials extend substantially further underneath the gate oxide. Consequently, the amount to which the effective channel length is reduced may be customized by altering the thickness of the sidewall spacer. Furthermore, this feature may be achieved without substantially altering the junction depth of the device, thereby advantageously improving the transistor drive current.

Figure 4:
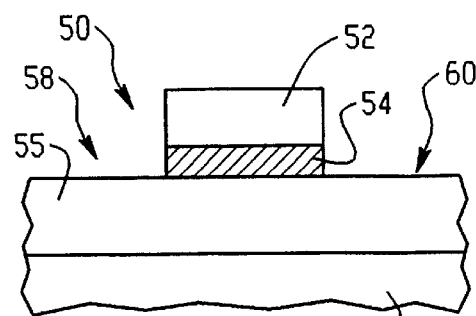
FIG. 4 is a fragmentary cross section diagram illustrating a gate and a gate oxide formed on a semiconductor substrate.

One embodiment of the present invention is illustrated in FIGS. 4–7 as a plurality of semiconductor processing steps. FIG. 4 is a fragmentary cross section diagram illustrating a transistor 50 including a gate 52 overlying a gate oxide 54 which in turn overlies an N-well region 55 in a semiconductor substrate 56. The gate 52 and the gate oxide 54 separate the transistor 50 into a drain region 58 and a source region 60. Preferably, the NMOS type transistors are shielded by a masking layer (not shown) to prevent exposure of the NMOS transistors areas to the subsequent steps performed on the drain region 58 and the source region 60, which will be described infra. One exemplary manner in which the transistor 50 is fabricated is described below. Although the present invention is described in accordance with a preferred series of fabrication steps, it should be understood that various manufacturing methods may be utilized and each is contemplated as falling within the scope of the present invention.

The starting material is a single crystal silicon wafer. Typically, the silicon wafer is a lightly doped <100> wafer forming the substrate 56 or a heavily doped <100> wafer with a lightly doped epitaxial layer at the surface. A P-channel transistor is fabricated in the N-doped well 55 within the lightly doped P-substrate 56. The N-well structure 55 is formed in any conventional manner such as by growing a thermal oxide layer, depositing a nitride film via chemical vapor deposition (CVD), applying a mask which generally protects the silicon surface but exposes the desired N-well areas, and implanting ions into the defined N-well area. The N-well ions are driven into the silicon by high temperature cycling to form the N-well region 55 and an oxide layer is then grown over the N-well 55. A $V_T$ threshold-adjust implant is then applied and the surface of the silicon wafer is then stripped of the oxide and nitride/oxide layers and a new oxide/nitride mask layer is formed for fabricating isolation structures (not shown).

The resulting field oxide isolation regions are then grown to define an active device region for the transistor 50. The nitride/oxide mask layer is subsequently removed from the active device region and the gate oxide layer 54 is then grown overlying the N-well 55. A polysilicon gate layer is then deposited preferably by CVD and a mask is applied to pattern the polysilicon into the gate structure 52. Although in this embodiment a polysilicon gate material is utilized, it should be understood that the polysilicon material is exemplary and other materials such as metal may also be used in the present invention. After the gate 52 and the gate oxide 54 are formed, the masking layer (not shown) is created to shield the NMOS transistors areas from the subsequent implantation steps. In a preferred embodiment, the masking layer is composed of a conventional photoresist material of approximately 1,000 angstroms which is formed and patterned according to conventional deposition and etch techniques. In the above manner, the partially completed transistor 50 of FIG. 4 is formed.

Figure 5:
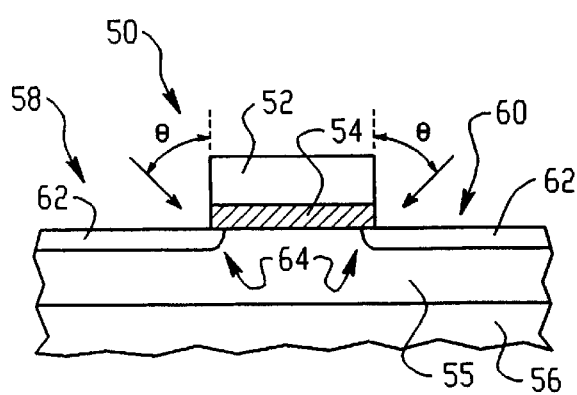
FIG. 5 is a fragmentary cross section diagram illustrating the structure of FIG. 4, wherein a large tilt angle implant is performed in a drain region and a source region of the substrate to form interstitials near the surface of the substrate that extend beneath a portion of the gate oxide.

In a preferred embodiment of the present invention, a large tilt angle implant is then performed, as illustrated in FIG. 5. The large tilt angle implant is preferably performed at an angle θ of about 30–60° measured from a normal to the surface of the substrate 56. The large tilt angle is performed in both the drain region 70 and the source region 72. To prevent shadowing, a quad implant is preferred, wherein four implants of equal dose are performed at a wafer rotation angle 90 degrees apart from each other. Thus, if, for example, a 40 degree tilt angle implant is performed it is completed in four steps. First, the 40 degree tilt angle implant is performed at a wafer rotation angle of 0 degrees, followed by three more implants at wafer rotation angles of 90, 180 and 270 degrees, respectively. In addition, the implant is preferably performed with a neutral species such as, for example, silicon or germanium. Alternatively, however, indium may also be utilized. The goal of the large tilt angle implant is not to form a dopant profile, but rather to generate interstitials (i.e., silicon atoms that have been knocked off their lattice sites) in the regions near the surface of the N-well 55 (hereinafter referred to as the "interstitial regions" 62). Although indium is not a neutral species (it is a P type dopant), it aggressively out diffuses during a subsequent thermal treatment and therefore does not significantly contribute as an impurity dopant. Therefore indium functions in a manner similar to silicon and germanium and effectively creates interstitials. Although silicon, germanium and indium are disclosed, other neutral species or other dopants may be utilized and are contemplated as falling within the scope of the present invention.

The interstitial regions 62 are shallow due to the large tilt angle utilized for the implant and the selected implant energy (additional details of the implantation energy will be discussed infra since the optimization of the large tilt angle implant is preferably a function of the lightly doped drain extension region which will be discussed shortly). In addition, due to the significant tilt angle θ, the interstitial regions 62 extend an extent 64 beneath the gate oxide 54.

The preferred concentration dose for the large tilt angle implant preferably depends upon the implant species used. The dose may preferably range between 10 to 30 percent of the amorphizing dose at room temperature for the respective species. For example, a silicon dose of $2 \times 10^{14} - 6 \times 10^{14}$ ions/cm$^2$ may be used when the silicon amorphizing dose is $2 \times 10^{15}$ ions/cm$^2$ at room temperature. The amorphizing doses at room temperature for germanium and indium are $4 \times 10^{14}$ and $1 \times 10^{14}$ ions/cm$^2$, respectively. The dose range to be used for germanium may be $4 \times 10^{13}$ to $1.2 \times 10^{14}$ ions/cm$^2$ and for indium the dose range may be $1 \times 10^{13}$ to $3 \times 10^{13}$ ions/cm$^2$. Although the concentration doses highlighted above are preferred depending upon which implant species utilized, it should be understood that a wide range of doses may be utilized and are contemplated as falling within the scope of the present invention.

The interstitials generated by the large tilt angle implant also help in reduction of channeling in the subsequent source/drain extension region implantation step, thereby advantageously helping to reduce the vertical depth of the source/drain extension region junctions which are subsequently formed in the drain region 58 and the source region 60.

Figure 6:
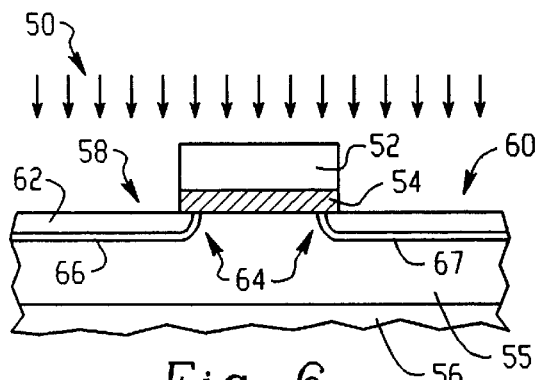
FIG. 6 is a fragmentary cross section diagram illustrating the structure of FIG. 5, wherein a substantially zero degree tilt angle drain extension region implant is performed in the drain region and the source region of the substrate.

After the formation of the interstitial regions 62, a lightly doped drain extension region 66 is formed in the drain region 58 and a lightly doped source extension region 67 is formed in the source region 60, as illustrated in FIG. 6. Preferably, a BF$_2$ implant having a tilt angle of approximately zero degrees is performed to form the extension regions 66 and 67, wherein the depth of the regions 66 and 67 are substantially deeper than the interstitial regions 62 (for example, approximately 600 Angstroms). BF$_2$ is the preferred dopant for the extension regions 66 and 67 because it has a substantial ionic weight and therefore amorphizes the crystal lattice in the drain region 58 and the source region 60, thereby substantially reducing the channeling in subsequent implantation steps which, as discussed above, advantageously aides in maintaining the desired shallow junction depths. Alternatively, a boron (B) implant may be used to form the extension regions 66 and 67. Due to boron being substantially lighter than BF$_2$, however, the boron implant does not amorphize the drain region 58 and the source region 60, thereby making the regions 58 and 60 more susceptible to channeling during subsequent implantation steps. Although the present invention is described in conjunction with BF$_2$ and B as exemplary dopant species, it should be understood that any P-type dopant may be used and is contemplated as falling within the scope of the present invention.

The concentration dose of the BF$_2$ implant is preferably in the range of about $1 \times 10^{14} - 5 \times 10^{15}$ ions/cm$^2$ and the implantation energy is about 30 keV or less. As stated above, it is desirable for the interstitial regions 62 to be substantially more shallow than the extension regions 66 and 67 so that the interstitials generated by the large tilt angle implant will not enhance diffusion in the vertical direction during subsequent thermal treatment. The lateral edge of the extension regions 66 and 67, however, substantially coincide with the lateral extent 64 of the interstitial regions 62 so that during subsequent thermal treatment, the interstitials enhance the lateral diffusion of the extension regions 66 and 67 under the gate oxide 54, thereby reducing the effective channel length of the transistor 50.

It is desirable to make the interstitial regions 62 substantially more shallow than the extension regions 66 and 67. In addition, the implantation energy of the large tilt angle implant should be selected to ensure that the interstitials are substantially shallower than the dopant profile of the extension regions 66 and 67 (for example, for a 5 keV boron implant the large tilt angle silicon implantation energy may be about 10 keV). Since the concentration doses and implantation energies of both implant steps (the large tilt angle implant and the drain extension region implant) may be varied over a wide range, the above preferred embodiment is merely exemplary and it should be understood that any optimized combination of concentration doses and energies that result in the interstitial regions 62 being substantially shallower than the extension regions 66 and 67 so that the interstitials do not substantially enhance diffusion in the vertical direction is contemplated as falling within the scope of the present invention.

Figure 7:
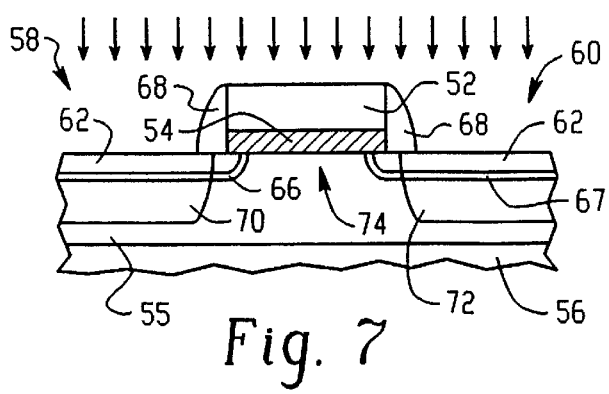
FIG. 7 is a fragmentary cross section diagram illustrating the structure of FIG. 6, wherein sidewall spacers are formed on the gate oxide and the drain region and a source region are exposed to a source/drain implant.

A suitable thickness (about 1,000 to 2,000 Angstroms) of oxide is formed over the transistor 50 via, for example, liquid phase oxide deposition and oxide sidewall spacers 68 are then formed, preferably by reactive ion etching (RIE), wherein the sidewall spacer 68 is about 0.1 micron thick, as illustrated in FIG. 7.

After the sidewall spacers 68 are formed, a source/drain ion implantation step is performed to form a drain 70 and a source 72 in the drain region 58 and the source region 60 of the N-well 55, respectively. The sidewall spacers 68 laterally shift the drain 70 and the source 72 away from the gate 52 such that a portion of the extension regions 66 and 67 are interposed between the regions 70 and 72 and a channel region 74 which underlies the gate oxide 54.

The source/drain implant is preferably a zero degree tilt angle implant using a P-type dopant (for example, $BF_2$) wherein the implantation dose is about $5 \times 10^{14} - 5 \times 10^{15}$ ions/$cm^2$ with an implantation energy of about 20–40 keV. In the above manner, the drain 70 and the source 72 are formed which are heavily doped P+ regions. Subsequent to the source/drain implantation of FIG. 7, a rapid thermal anneal (RTA) is performed, for example, at about 1,000° C. for about 30 seconds to activate the dopant species and repair the lattice damage caused by the implantations. Note that the above doses and energies are preferred, however, the invention also applies to doses and energies outside of the above-mentioned ranges.

Figure 8:
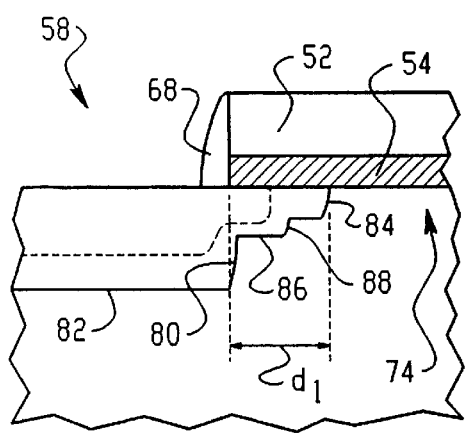
FIG. 8 is an amplified fragmentary cross section diagram of the structure of FIG. 7 illustrating the enhanced lateral diffusion in the drain extension region according to the present invention.

The RTA causes diffusion of the drain 70 and the source 72 and the extension regions 66 and 67 in both the lateral and vertical directions 80 and 82, as illustrated in FIG. 8. The lateral diffusions 80 and 88 and the vertical diffusions 82 and 86 experience diffusion governed by Fick's law as well as enhanced diffusion of boron due to the pairing of boron with silicon interstitials. However, the dopants under the gate 54 are subjected to further lateral enhanced diffusion 84 which is due to the interstitials formed by the large tilt angle implant. The enhanced lateral diffusion 84 is due to the interstitials pairing with the impurity dopants (e.g., $B/BF_2$) which accelerate the diffusion. Since the interstitials of regions 62 are located near the lateral edge of the extension regions 66 and 67, the enhanced diffusion occurs laterally under the gate oxide which reduces the effective length of the channel 74. Likewise, since the interstitials are shallow (i.e., located near the surface) they are not located near the bottom profile of either the regions 70 and 72 or the extension regions 66 and 67. Consequently, the interstitials do not appreciably contribute to the diffusion in the vertical direction.

Therefore the large tilt angle implant generates shallow interstitials which are located near the lateral edge of the extension regions 66 and 67, thereby providing enhanced lateral diffusion without enhanced vertical diffusion and providing a reduction in the effective length of the channel 74 without increasing the junction depth of the regions 70 and 72 and the extension regions 66 and 67.

FIG. 8 illustrates the diffusion caused by the RTA, wherein the dotted line illustrates the composite impurity dopant and interstitial profile prior to the RTA and the solid line represents the completed junction depth profile after the lateral, vertical and enhanced lateral diffusions 80, 82, 84, 86 and 88, respectively.

Figure 9:
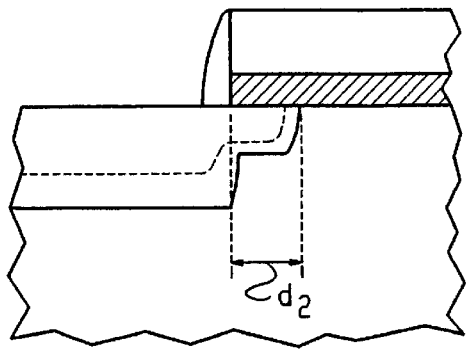
FIG. 9 is an amplified fragmentary cross section diagram illustrating the lightly doped drain extension region of prior art FIG. 3.

The distance to which the drain extension region 66 extends below the gate oxide 54 is labeled in FIG. 8 as $d_1$. The distance $d_1$ is larger than that experienced in prior art LDD transistors due to the enhanced lateral diffusion 84 provided by the presence of interstitials near the lateral edge of the drain extension region 66. Conventionally, as illustrated in prior art FIG. 9, the distance $d_2$ to which the drain extension region extends below the gate oxide was dictated by Fick's type diffusion and enhanced boron diffusion. $d_1$ of FIG. 8, however, results from Fick's diffusion, enhanced diffusion as well as lateral enhanced diffusion due to the presence of the interstitials provided by the large tilt angle implant. Consequently $d_1 > d_2$, thereby resulting in a reduced effective channel length without the conventional trade-off of increased junction depths. Therefore according to the present invention a reduced channel length transistor is provided without adversely increasing the source/drain extension junction depth.

Figure 10:
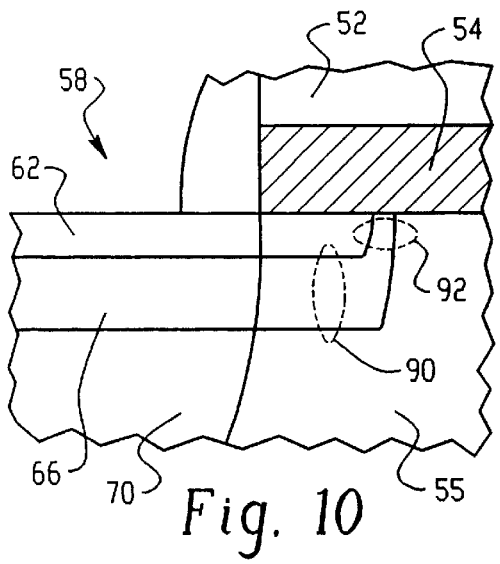
FIG. 10 is an amplified fragmentary cross section diagram illustrating the present invention prior to thermal treatment, wherein the interstitials generated by the large tilt angle implant reside near the lateral edge of the lightly doped drain extension region.
Figure 11:
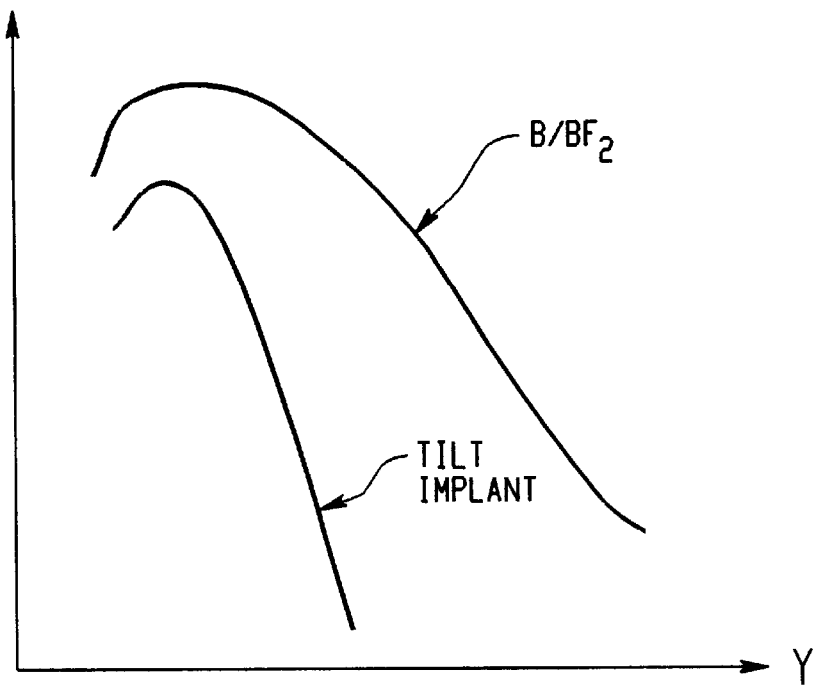
FIG. 11 is a graph illustrating the dopant and interstitial profiles of the lightly doped drain extension region and the large tilt angle implant in a vertical portion of the lightly doped drain extension region of FIG. 10 according to the present invention.
Figure 12:
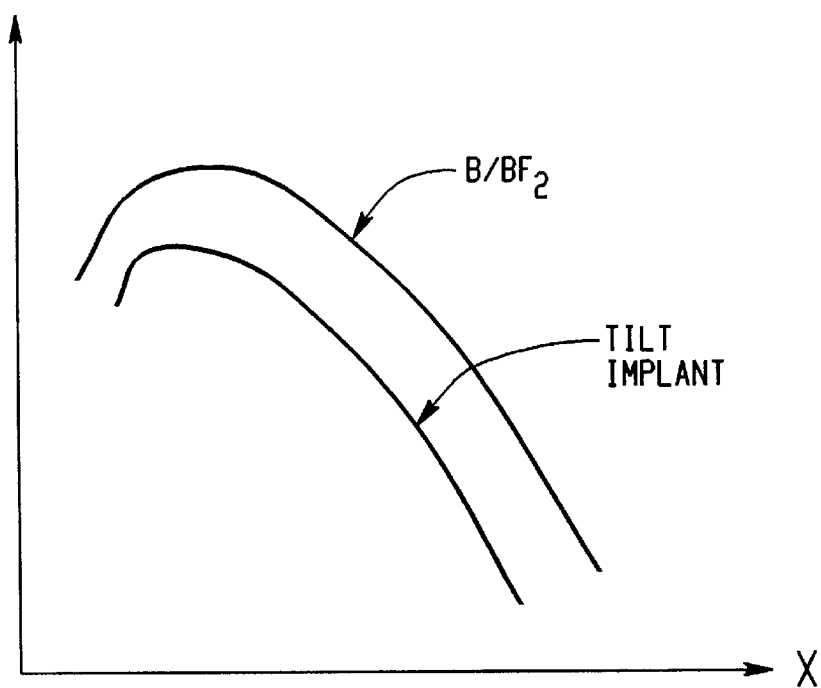
FIG. 12 is a graph illustrating the dopant and interstitial profiles of the lightly doped drain extension region and the large tilt angle implant at a point close to the lateral edge of the lightly doped drain extension region of FIG. 10 according to the present invention.

The manner in which the present invention achieves the enhanced lateral diffusion 84 without a substantial change in the vertical diffusions 82 and 86 may be better understood in conjunction with FIGS. 10–12. In FIG. 10, the impurity dopant and interstitial profiles of regions 62, 66 and 70 are illustrated in an amplified cross section of the drain region 58 of the transistor 50 near the gate 52 and the gate oxide 54. At a first region 90 (the vertical portion), the interstitial region 62 is substantially more shallow than the drain extension region 66 and consequently the distance between the tails of the interstitial region 62 and the drain extension region 66 are far apart, which is illustrated in greater detail in the concentration profile of FIG. 11. Because of the significant distance between the interstitials and the tail of the drain extension region 66 in the first region 90 the interstitials do not significantly contribute to the vertical diffusion of the drain extension region 66 and the drain 70 in the vertical direction. Conversely, in the second region 92 (the lateral portion), the lateral edge of the interstitial region 62 and the drain extension region 66 are substantially coincident, or at least relatively close together. Therefore the lateral tail of the interstitial region 62 and the drain extension region 66 are close together as illustrated in FIG. 12 and the interstitials contribute significantly to the lateral diffusion of the drain extension region 66. Since the lateral diffusion of the drain extension region 66 is aided by the presence of excess interstitials in the interstitial region 62, the interstitial region 62 enhances the lateral diffusion near the surface of the transistor 50 as illustrated in FIG. 8, thereby reducing the effective channel length of the transistor 50.

Figure 13:
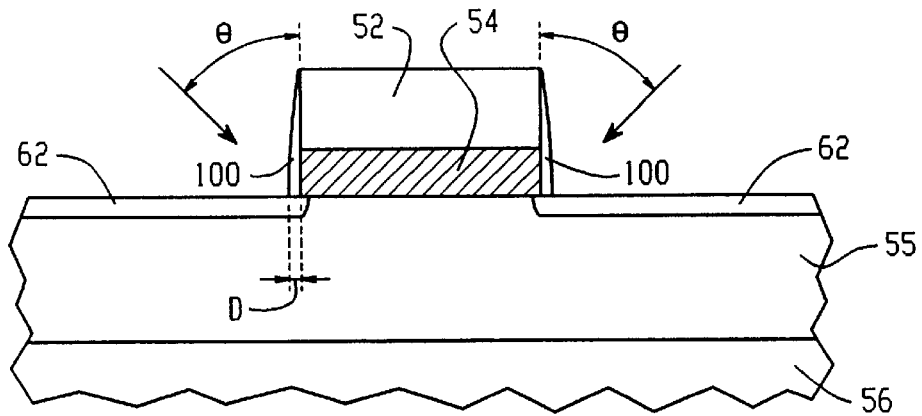
FIG. 13 is a fragmentary cross section diagram illustrating another aspect of the present invention, wherein a large tilt angle implant is performed after the formation of a first sidewall spacer to control the lateral location of interstitials formed by the implant.
Figure 14:
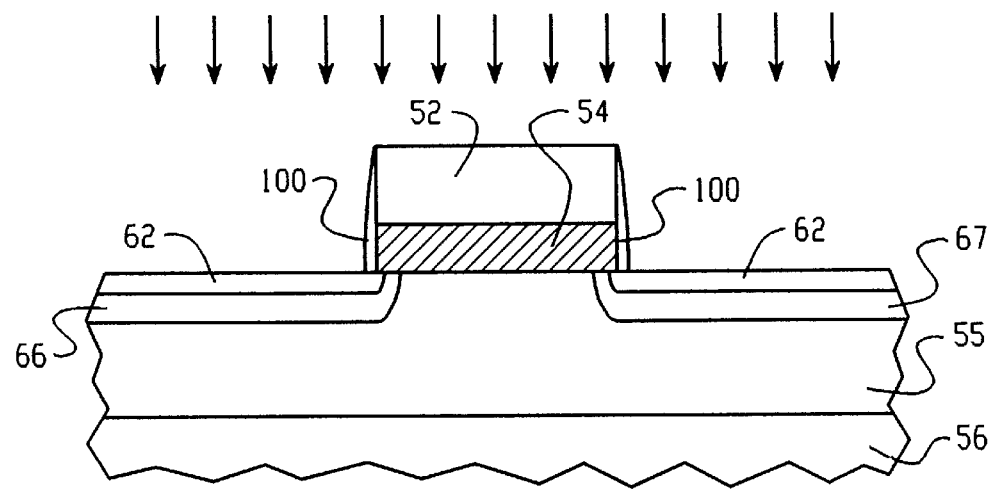
FIG. 14 is a fragmentary cross section diagram illustrating an implant step for forming the lightly doped extension regions.
Figure 15:
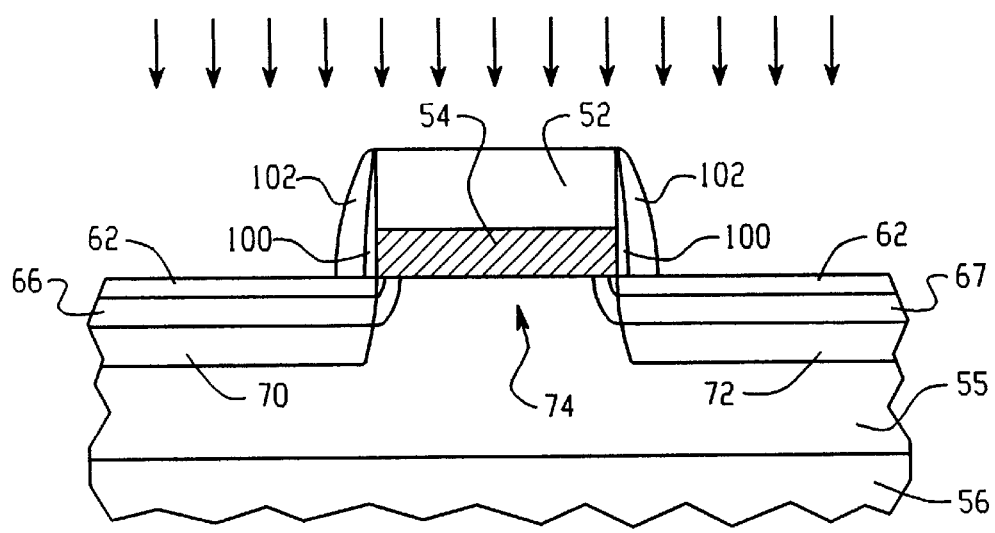
FIG. 15 is a fragmentary cross section diagram illustrating an implant step for forming the source and drain regions of the transistor after the formation of a second sidewall spacer.

According to another embodiment of the present invention, a method of controlling a gate-to-drain overlap capacitance for a reduced channel length lightly doped drain transistor (RCL-LDD) is disclosed. As illustrated in FIG. 13, prior to a large tilt angle implant (as discussed above), first sidewall spacers 100 are formed on both sides of the gate oxide 54. Preferably, the first sidewall spacers 100 are formed via a liquid phase oxide deposition followed by an RIE, however, other methods of forming the sidewall spacers 100 are contemplated by the present invention. The first sidewall spacers 100 have a thickness D which can be adjusted based on the oxide thickness deposited and the RIE performed. The thickness D is preferably adjusted to customize the amount of gate-to-drain overlap ($C_{gdo}$) of the transistor 50.

Although the present invention, as illustrated in FIG. 8, substantially reduces the channel length without an appreciable increase in junction depth, the enhanced lateral diffusion also increases the overlap capacitance created by the gate 52 and the drain extension region 66, with the gate oxide 54 as the dielectric. The increase in gate-to-drain capacitance ($C_{gdo}$) undesirably results in a decrease in transistor switching speed since the amount of time needed to discharge the gate 52 will increase as $C_{gdo}$ increases. In some cases a designer may wish to customize the $C_{gdo}$ to trade-off transistor drive current and transistor switching speed. In such an In such an instance, an increase in the thickness of the first sidewall spacers 100 will increase the effective channel length while reducing the drain-to-gate overlap capacitance $C_{gdo}$.

After forming the first sidewall spacers 100, a large tilt angle implant is performed to generate interstitials that are near the surface of the N-well 55. The thickness of the sidewall spacers 100 dictate the extent to which the interstitial regions 62 and the extension regions 66 and 67 extend underneath the gate oxide 52. If the sidewall spacers 100 are very thin (for example, about 100 Angstroms), the decrease in the drain-to-gate overlap capacitance is small and if the sidewall spacers 100 are thicker (for example, about 200 Angstroms), the drain-to-gate overlap capacitance may be reduced. However, for the wider spacer 100 the source/drain series resistance increases. In the above manner, the first sidewall spacer 100 of the present invention allows for the customization of the drain-to-gate capacitance and source/drain series resistance (and therefore the effective channel length of the transistor 50) for optimum transistor performance without impacting the junction depths.

Like the previous embodiment, it is preferred that the sub-amorphous large tilt angle implant precede the extension region implant to create enough damage near the surface of the N-well region 55 to thereby reduce the potential of channeling during the extension region implant. The present invention, however, also contemplates performing the large tilt angle implant after the extension region implant. The large tilt angle implant is preferably a neutral species or an impurity dopant that substantially out diffuses during annealing such as indium, as was discussed above in the previous embodiment.

A extension region implant is then performed in a manner similar to the previous embodiment; subsequently, second sidewall spacers 102 are formed on the first sidewall spacers 100. The second sidewall spacers 102 substantially correspond to the spacers 68 of FIG. 7, wherein the sidewall spacers 102 laterally displace the drain 70 and the source 72 in the N-well 55 so that a portion of the extension regions 66 and 67 are disposed between the regions 70 and 72 and the channel 74. After formation of the drain 70 and the source 72 through a source/drain implantation step, an RTA is performed, wherein the extension regions 66 and 67 experience enhanced lateral diffusion due to the interstitials near the surface that underlie the gate oxide 52.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of reducing an effective channel length of a lightly doped drain transistor, comprising the steps of:

forming a gate electrode and a gate oxide over a semiconductor substrate;

implanting a region of the substrate where a drain is formed with a large tilt angle implant which supplies interstitials at a location under the gate oxide;

forming a lightly doped drain extension region in the region of the substrate where the drain is formed;

forming a drain in the region where the drain is formed and a source in a source region of the substrate; and thermally treating the substrate, wherein the interstitials enhance a lateral diffusion under the gate oxide without substantially impacting a vertical diffusion of the extension region, thereby reducing the effective channel length without an increase in a junction depth of the drain and the drain extension region.

2. The method of claim 1, wherein the tilt angle is in the range of about 30–60°.

3. The method of claim 1, wherein the step of implanting the region where the drain is formed with the large tilt angle implant precedes the step of forming the lightly doped drain extension region.

4. The method of claim 1, wherein the step of implanting the region where the drain is formed with the large tilt angle implant comprises implanting one of silicon, germanium or indium.

5. A method of reducing an effective channel length of a lightly doped drain transistor, comprising the steps of:

forming a gate electrode and a gate oxide over a semiconductor substrate;

implanting a region of the substrate where a drain is formed with a large tilt angle implant which supplies interstitials at a location under the gate oxide, wherein the step of implanting the region where the drain is formed with the large tilt angle implant comprises implanting a sub-amorphous dose into the drain region;

forming a lightly doped drain extension region in the region of the substrate where the drain is formed;

forming a drain in the region where the drain is formed and a source in a source region of the substrate; and thermally treating the substrate, wherein the interstitials enhance a lateral diffusion under the gate oxide without substantially impacting a vertical diffusion of the extension region, thereby reducing the effective channel length without an increase in a junction depth of the drain and the drain extension region.

6. A method of reducing an effective channel length of a lightly doped drain transistor, comprising the steps of:

forming a gate electrode and a gate oxide over a semiconductor substrate;

implanting a region of the substrate where a drain is formed with a large tilt angle implant which supplies interstitials at a location under the gate oxide, wherein a dose of the large tilt angle implant is about 10–30 percent of an amorphizing dose;

forming a lightly doped drain extension region in the region of the substrate where the drain is formed;

forming a drain in the region where the drain is formed and a source in a source region of the substrate; and thermally treating the substrate, wherein the interstitials enhance a lateral diffusion under the gate oxide without substantially impacting a vertical diffusion of the extension region, thereby reducing the effective channel length without an increase in a junction depth of the drain and the drain extension region.

7. The method of claim 1, wherein the step of thermally treating the substrate comprises performing a rapid thermal anneal.

8. The method of claim 1, wherein a composite doping profile and interstitial profile under the gate oxide comprises a large concentration gradient along a lateral edge of the drain extension region and a substantially smaller concentration gradient along a bottom portion of the drain extension region, thereby resulting in an enhanced lateral diffusion under the gate oxide.

9. A method of reducing an effective channel length of a lightly doped drain transistor, comprising the steps of:

forming a gate electrode and a gate oxide over a semiconductor substrate;

implanting a region of the substrate where a drain is formed with a large tilt angle implant which supplies interstitials at a location under the gate oxide;

forming a lightly doped drain extension region in the region of the substrate where the drain is formed;

forming a drain in the region where the drain is formed and a source in a source region of the substrate; and thermally treating the substrate, wherein the interstitials enhance a lateral diffusion under the gate oxide without substantially impacting a vertical diffusion of the extension region, thereby reducing the effective channel length without an increase in a junction depth of the drain and the drain extension region, further comprising the step of forming a first sidewall spacer on a drain side of the gate and the gate oxide before the implanting of the region where the drain is formed with the large tilt angle implant, wherein a thickness of the first sidewall spacer controls the location of dopants under the gate oxide, thereby allowing the reduce channel length of the transistor to be customized.

10. The method of claim 9, further comprising the step of forming a second sidewall spacer adjacent to the first sidewall spacer before the forming of the drain, wherein the drain region and the drain extension region overlap and the second sidewall spacer laterally staggers the drain region and the drain extension region.

11. The method of claim 1, further comprising the step of implanting the source region of the substrate with the large tilt angle implant, thereby supplying interstitials at a location in the source region under the gate oxide.

12. The method of claim 1, wherein implanting the drain region with the large tilt angle implant comprises performing a quad implant.

13. The method of claim 1, further comprising the step of forming a lightly doped source extension region in the source region of the substrate at the same time the lightly doped drain extension region is formed.

14. A method of forming a transistor, comprising the steps of:

forming a gate electrode and a gate oxide over a semiconductor substrate;

supplying interstitials in at least one of a region of the substrate where a drain is formed and a region of the substrate where a source is formed;

forming an extension region in the at least one of the region where the drain is formed and the region where the source is formed;

forming a drain in the region where the drain is formed and a source in a region where the source is formed; and thermally treating the substrate, wherein the interstitials enhance a lateral diffusion under the gate oxide without substantially impacting a vertical diffusion of the extension region, thereby reducing the effective channel length without an increase in a junction depth of the extension region.

15. The method of claim 14, wherein the step of supplying interstitials comprises the step of implanting at least one of the region where the drain is formed and the region where the source is formed with a large tilt angle implant, thereby supplying interstitials at a location under the gate oxide.

* * * * *

UNITED STATES PATENT AND TRADEMARK OFFICE
CERTIFICATE OF CORRECTION

PATENT NO.: 5,970,353

DATED: October 19, 1999

INVENTOR(S): Akif Sultan

It is certified that error appears in the above-identified patent and that said Letters Patent is hereby corrected as shown below:

Column 9, Line 19: Please delete the first phrase "In such an".

Claim 10. The method of claim 9, further comprising the step of forming a second sidewall spacer adjacent to the first sidewall spacer before the forming of the drain region, wherein the drain region and the drain extension region overlap and the second sidewall spacer laterally staggers the drain region and the drain extension region.

Signed and Sealed this

Second Day of May, 2000

*Attest:*

Q. TODD DICKINSON

*Attesting Officer*      *Director of Patents and Trademarks*